United States Patent
Hopf et al.

(10) Patent No.: US 10,825,937 B2
(45) Date of Patent: Nov. 3, 2020

(54) PROTECTIVE CIRCUIT FOR A PHOTOVOLTAIC (PV) MODULE, METHOD FOR OPERATING THE PROTECTIVE CIRCUIT, AND PHOTOVOLTAIC (PV) SYSTEM HAVING SUCH A PROTECTIVE CIRCUIT

(71) Applicant: SMA Solar Technology AG, Niestetal (DE)

(72) Inventors: Markus Hopf, Espenau (DE); Burkard Mueller, Kassel (DE)

(73) Assignee: SMA Solar Technology AG, Niestetal (DE)

(*) Notice: Subject to any disclaimer, the term of this patent is extended or adjusted under 35 U.S.C. 154(b) by 134 days.

(21) Appl. No.: 16/101,786

(22) Filed: Aug. 13, 2018

(65) Prior Publication Data

US 2018/0351015 A1    Dec. 6, 2018

Related U.S. Application Data

(63) Continuation of application No. PCT/EP2016/080227, filed on Dec. 8, 2016.

(30) Foreign Application Priority Data

Feb. 11, 2016  (DE) .......................... 10 2016 102 417

(51) Int. Cl.
*H01L 31/0224* (2006.01)
*H01L 31/02* (2006.01)
(Continued)

(52) U.S. Cl.
CPC .............. *H01L 31/022425* (2013.01); *H01L 31/02021* (2013.01); *H01L 31/044* (2014.12);
(Continued)

(58) Field of Classification Search
USPC ........................................................ 361/2–13
See application file for complete search history.

(56) References Cited

U.S. PATENT DOCUMENTS

2007/0236848 A1* 10/2007 Mayell .................. H02H 9/001
361/93.1
2012/0194003 A1   8/2012 Schmidt
(Continued)

FOREIGN PATENT DOCUMENTS

DE      102010023549 A1   12/2011
WO        2010078303 A2    7/2018

OTHER PUBLICATIONS

International Search Report dated Mar. 13, 2017 in connection with International Application PCT/EP2017/080227.

*Primary Examiner* — Danny Nguyen
(74) *Attorney, Agent, or Firm* — Eschweiler & Potashnik, LLC

(57) ABSTRACT

The disclosure relates to a protective circuit for a photovoltaic (PV) module that includes an input having two input terminals for connecting the PV module, an output having two output terminals for connecting further PV modules of a series circuit comprising PV modules, a first switch for connecting one of the input terminals to one of the output terminals, and a controller configured to control the first switch, wherein the protective circuit further includes a series circuit including a first diode and an energy store, wherein the series circuit is arranged in parallel with the input of the protective circuit. The protective circuit also includes a second diode, which connects an output terminal of the protective circuit to a midpoint of the series circuit including the first diode and the energy store, and wherein a series circuit including the second diode and the energy store is connected in parallel with the first switch. The disclosure also relates to a method for operating a protective circuit (Continued)

according to the disclosure, and to a photovoltaic (PV) system including a series circuit comprising PV modules.

23 Claims, 8 Drawing Sheets

(51) Int. Cl.
| | | |
|---|---|---|
| *H01L 31/044* | (2014.01) | |
| *H02H 3/02* | (2006.01) | |
| H02H 3/08 | (2006.01) | |
| H02S 40/34 | (2014.01) | |
| H02H 3/20 | (2006.01) | |

(52) U.S. Cl.
CPC ............ *H02H 3/023* (2013.01); *H02H 3/025* (2013.01); *H02H 3/08* (2013.01); *H02H 3/20* (2013.01); *H02S 40/34* (2014.12); *Y02E 10/50* (2013.01)

(56) References Cited

U.S. PATENT DOCUMENTS

| | | |
|---|---|---|
| 2015/0131187 A1 | 5/2015 | Krein |
| 2015/0381108 A1* | 12/2015 | Hoft ........................ G01R 31/52 136/244 |
| 2016/0099573 A1 | 4/2016 | Hopf |

* cited by examiner

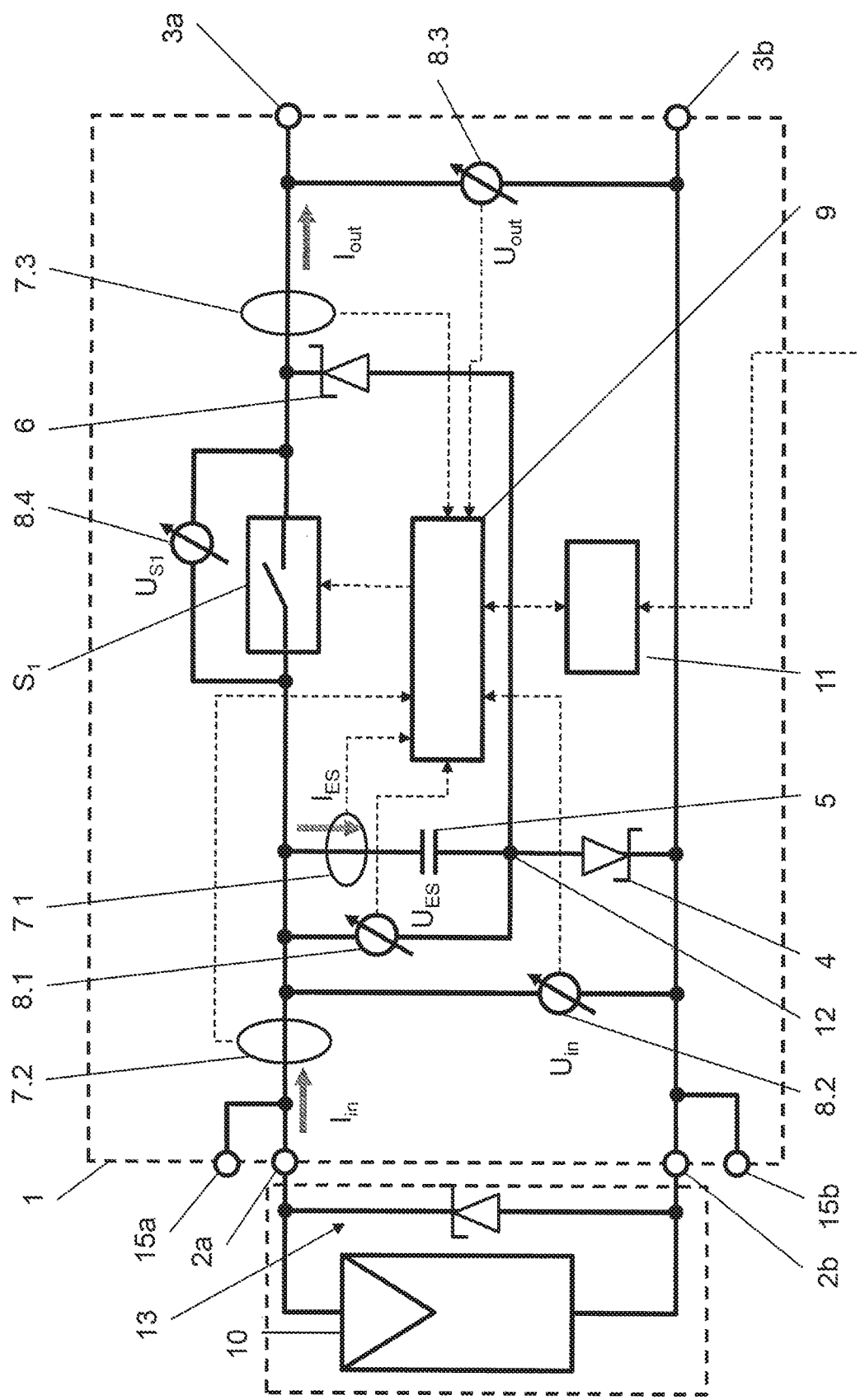

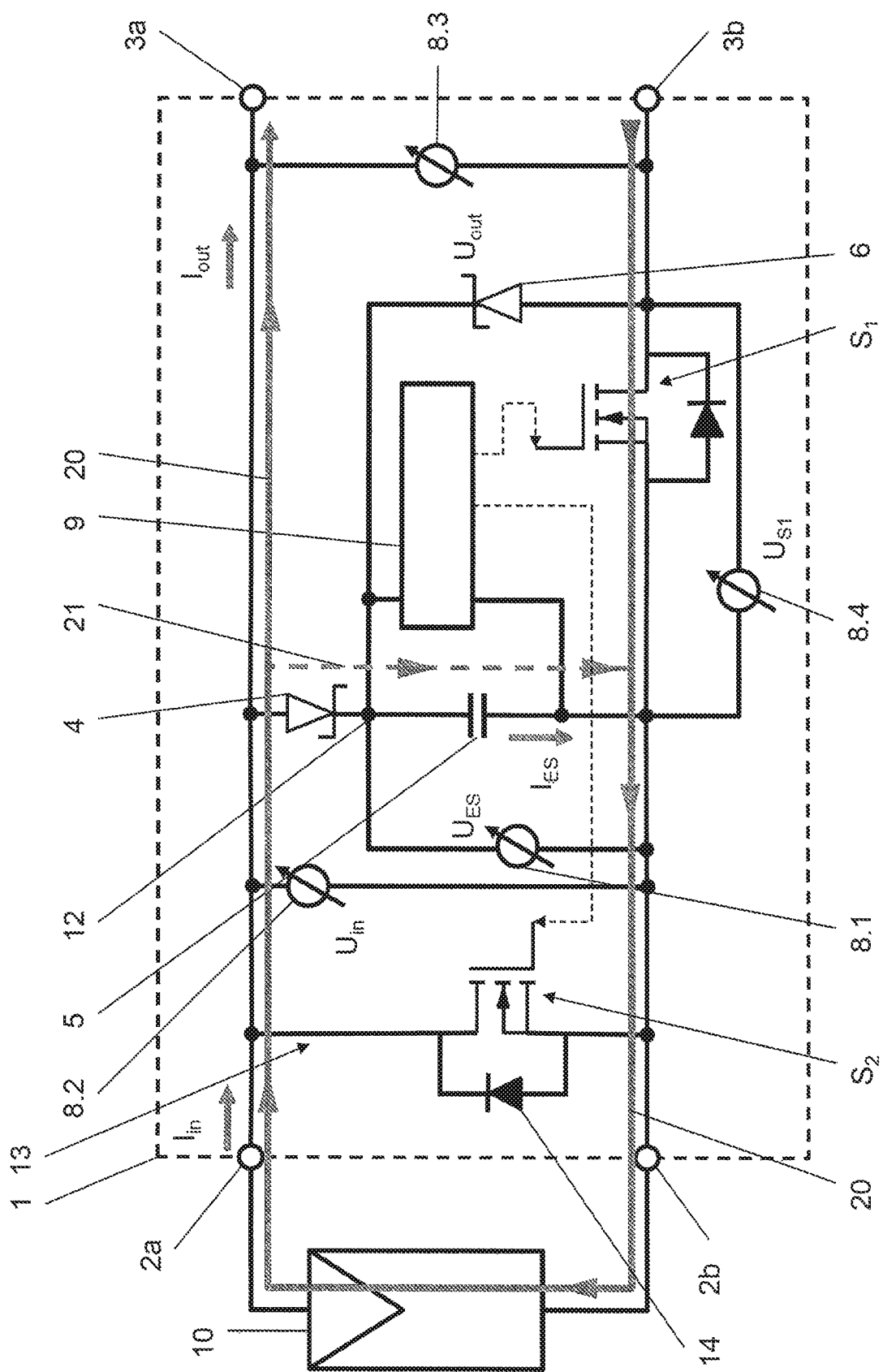

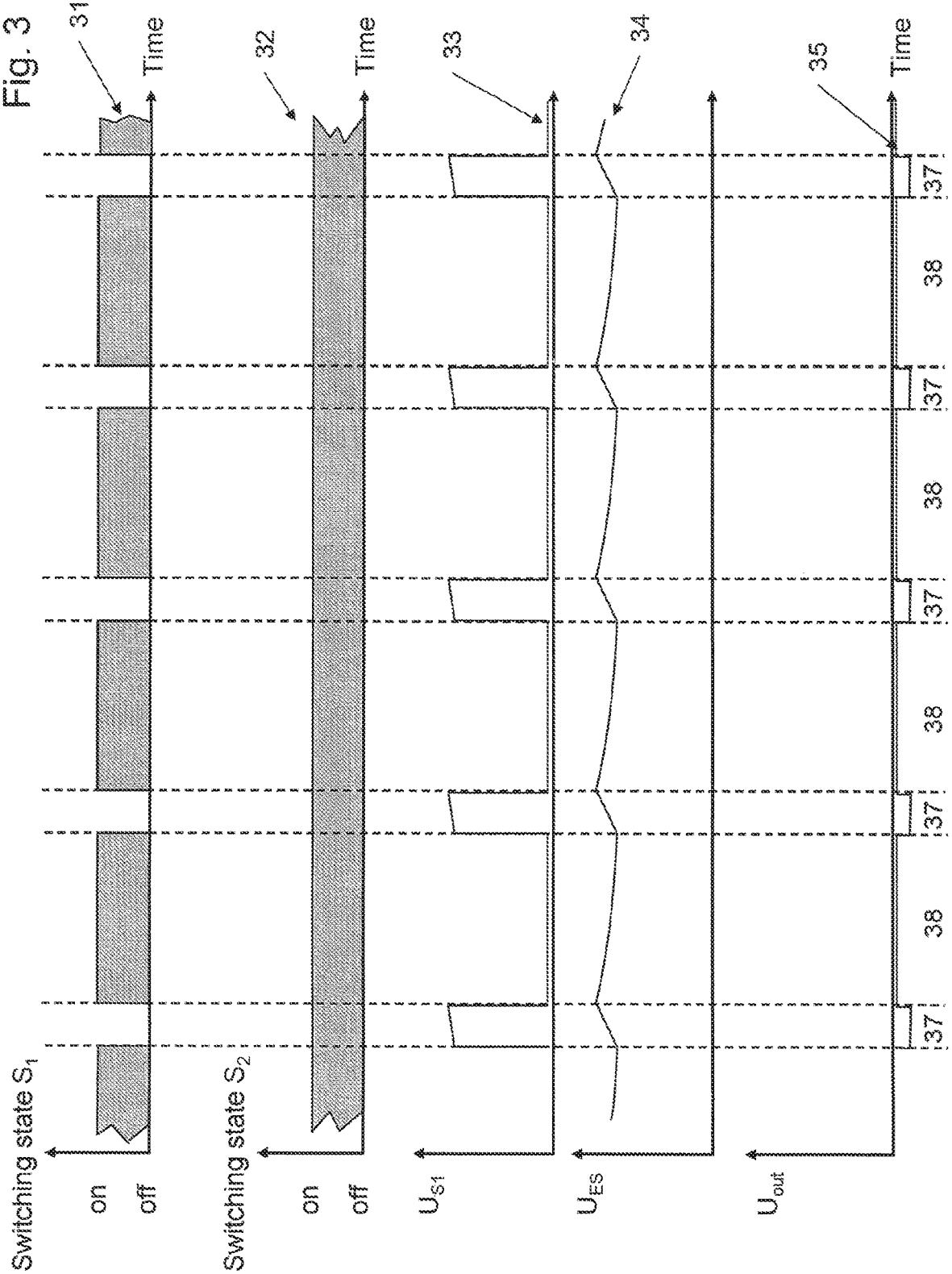

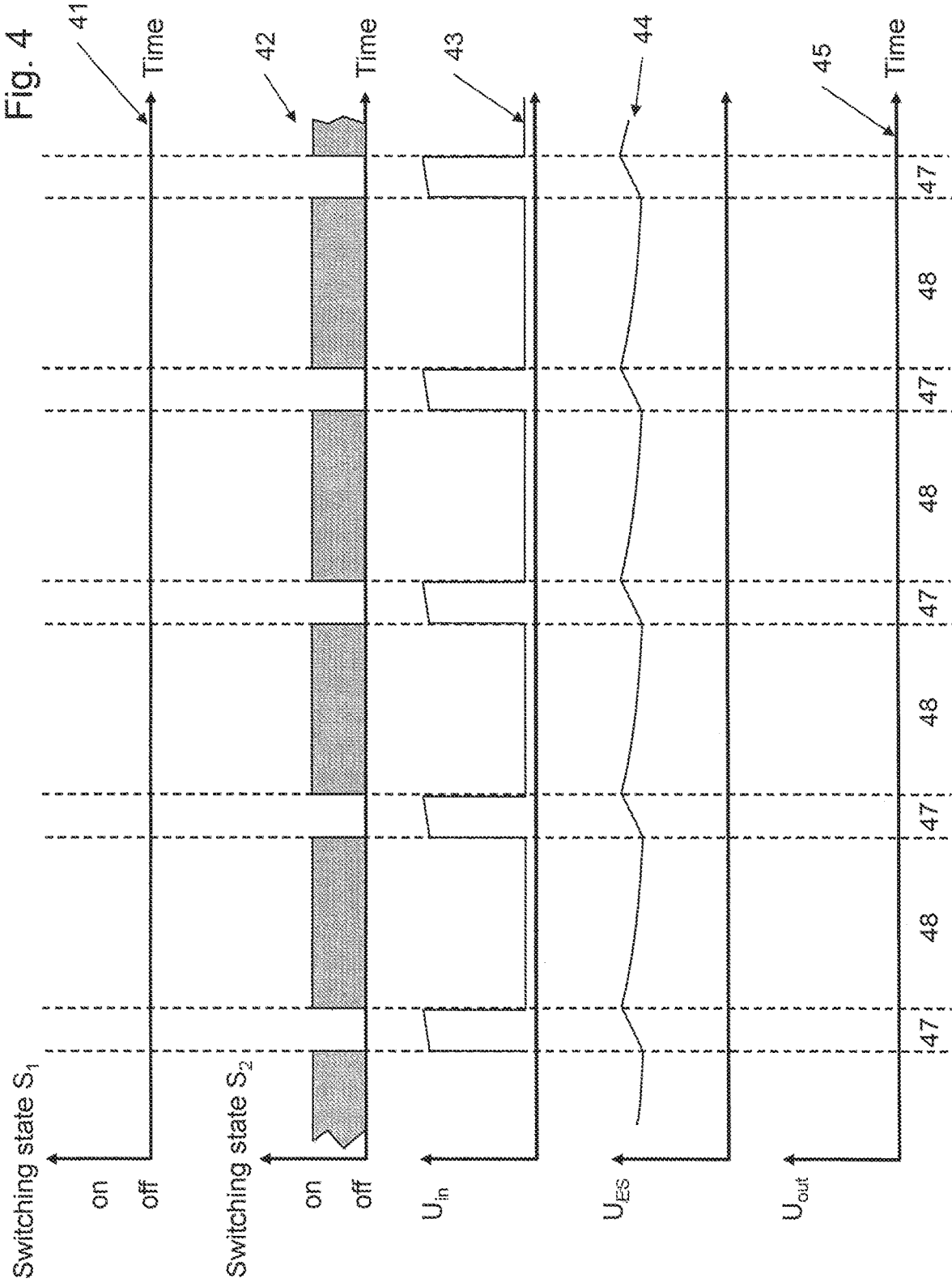

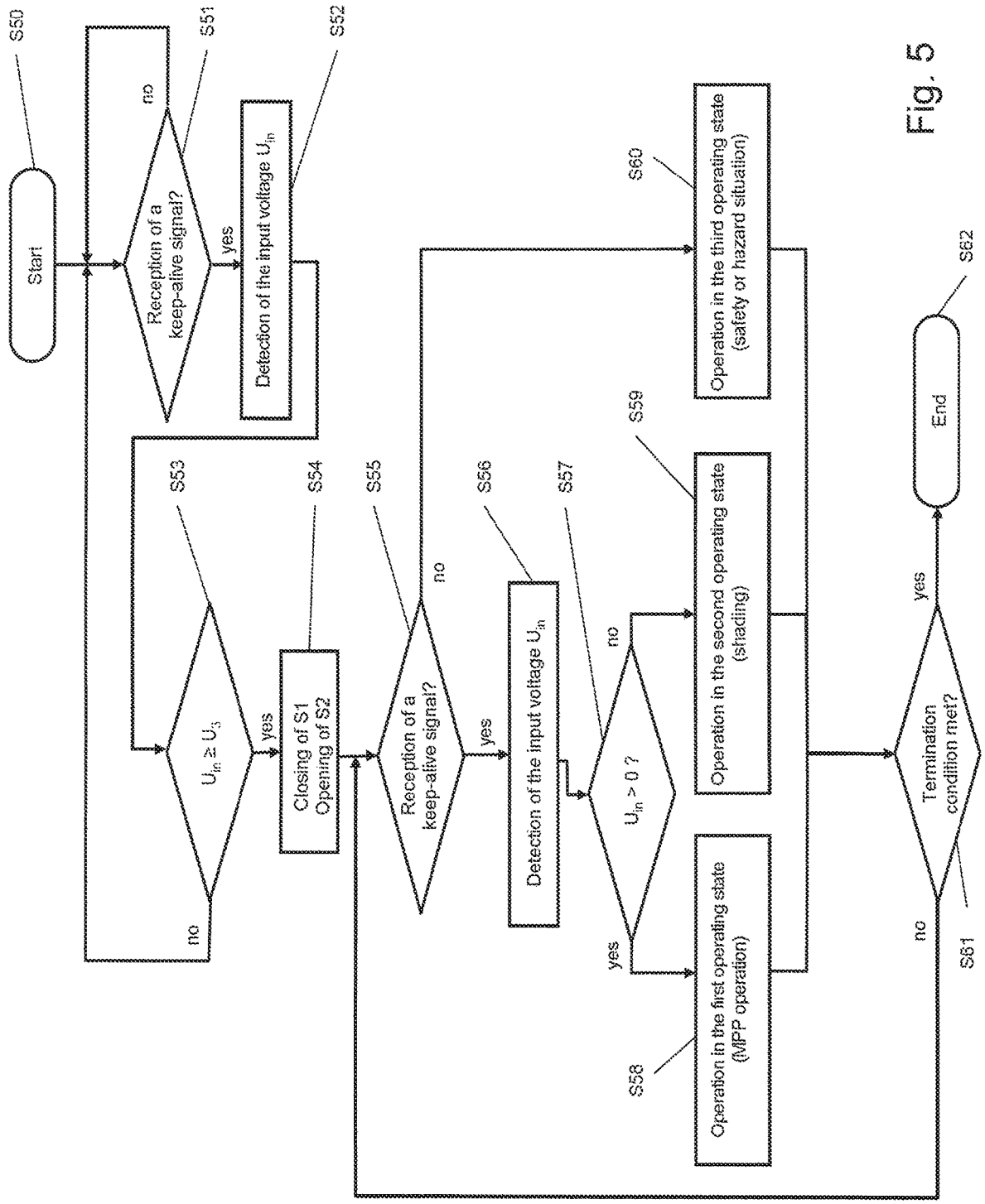

PROTECTIVE CIRCUIT FOR A PHOTOVOLTAIC (PV) MODULE, METHOD FOR OPERATING THE PROTECTIVE CIRCUIT, AND PHOTOVOLTAIC (PV) SYSTEM HAVING SUCH A PROTECTIVE CIRCUIT

CROSS REFERENCE TO RELATED APPLICATIONS

This application is a continuation of International Patent Application number PCT/EP2016/080227, filed on Dec. 8, 2016, which claims priority to German Patent Application number 10 2016 102 417.1, filed on Feb. 11, 2016, and is hereby incorporated by reference in its entirety.

FIELD

The disclosure relates to a protective circuit for a photovoltaic (PV) module, a method for operating a protective circuit of this type, and a photovoltaic (PV) system comprising a plurality of PV modules, at least one PV module of which comprises a protective circuit of this type.

BACKGROUND

A protective circuit should be understood to mean an electrical circuit which is connected downstream of a PV module and which is designed to enable an energy emission of the PV module connected to it on the input side, or otherwise to suppress the energy emission and to disconnect the PV module assigned to the protective circuit. A protective circuit of this type is typically arranged in direct proximity to the PV module assigned to it, e.g. in a connection box of the corresponding PV module. In this case, a disconnection of the PV module is desired in particular in a safety or hazard situation, in order to avoid high voltages on connecting lines between a series circuit comprising PV modules and a photovoltaic (PV) inverter of a PV system. Such a safety or hazard situation may occur for example when there is a fire in a building at which the PV system is installed. A disconnection of the PV modules ensures that the connection lines to the inverter and also the connecting lines of the series circuit comprising PV modules among one another are free of voltage, but at least have a voltage below a risky voltage value. Endangerment of persons, for example firefighters tackling the fire, is precluded in this way.

The main task of a protective circuit of the generic type is thus connection or disconnection of the PV module assigned to it. In addition to this main task, however, a protective circuit can also perform further tasks. Corresponding tasks include for example detecting electrical parameters of the PV module assigned to the protective circuit, evaluating the electrical parameters and, if appropriate, initiating an action in reaction to this evaluation, for example reducing a power loss of the PV module assigned to the protective circuit in the event of shading of the PV module, and communicating with other protective circuits of PV modules and/or with a PV inverter of a PV system.

Since, if necessary, each PV module of a PV system is usually equipped with a corresponding protective circuit, it is desirable that the protective circuit can be constructed as simply and cost-effectively as possible, in particular with the lowest possible component outlay.

US 2015 0131187 A1 discloses a circuit and a method for protecting a PV string. The circuit comprises a bypass switch connected in parallel with the PV string, and a hot spot switch connected in series with the PV string. Upon detection of a hot spot state, firstly the bypass switch is closed via a first control signal and then the hot spot switch is opened via a second control signal.

WO 2011 023732 A2 discloses a bypass and protective circuit for a PV module. The bypass and protective circuit includes an input for connecting the PV module and an output. The protective circuit furthermore includes a bypass element, which is connected in parallel with the output of the protective circuit, and a disconnecting element, which is connected between the input and the output. In that case, the disconnecting element is configured to control a connection between the input and the output. A controller for driving the disconnecting element is supplied from the PV module connected to the protective circuit on the input side.

With the disconnecting element open, an energy emission of the PV module to the output of the protective circuit is prevented. In that case, the controller of the protective circuit is still supplied from the PV module connected on the input side. For correct operation of the protective circuit it is therefore necessary for a PV module always to be connected on the input side. Furthermore, it is necessary for the connected PV module to provide enough voltage or electrical power for supplying the controller of the protective circuit assigned to it in every operating state, that is to say in particular even in the event of extreme shading. That is not provided, at the very least however not reliably provided, in particular in a maintenance situation requiring e.g. an exchange of the PV module and/or in the event of a defect of the connection line between PV module and protective circuit. Furthermore, extreme shading of the PV module can have the effect that a power required for supplying the controller cannot be provided, at the very least however cannot be reliably provided, via the PV module connected on the input side.

The document DE 10 2013 101 314 A1 discloses a PV system including at least one PV string of PV modules and a system for individually disconnecting the PV modules, and for reliably initially switching on or switching on again the disconnected PV modules. In that case, solar connection boxes of the PV modules are configured in an at least partly "intelligent" fashion and include a safety circuit that defines an operating state and a safety state. The solar connection boxes are switched from the safety state to the operating state as a result of a start current or start signal being impressed. To that end, the system includes a start box connected between a PV inverter and the PV string, the start box being designed to be supplied via its input by the PV string connected there, or via its output. In that case, a supply via the output of the start box is effected by means of a reverse current directed oppositely to a current in normal operation of the PV system.

SUMMARY

The disclosure addresses the problem of demonstrating a protective circuit for a photovoltaic (PV) module which is reliably electrically supplied in every state of the PV module, in particular even in the case where a PV module is not connected, or not correctly connected, or in the case of an extremely shaded PV module connected to the protective circuit on the input side. In this case, the protective circuit is intended to be constructed as simply and cost-effectively as possible. Furthermore, the disclosure addresses the problem of specifying an operating method for a protective circuit of this type, and of demonstrating a PV system comprising a protective circuit of this type.

A protective circuit according to the disclosure for a photovoltaic (PV) module comprises an input having two input terminals for connecting the PV module, and an output having two output terminals for connecting further PV modules of a series circuit comprising PV modules. Furthermore, the protective circuit comprises a first switch for connecting one of the input terminals to one of the output terminals, and a controller configured for controlling the first switch.

The protective circuit is characterized in that it furthermore firstly comprises a series circuit comprising a first diode and an energy store, wherein the series circuit is arranged in parallel with the input of the protective circuit, and secondly comprises a second diode, which connects an output terminal of the protective circuit to a midpoint of the series circuit comprising the first diode and the energy store. In this case, a series circuit comprising the second diode and the energy store is connected in parallel with the first switch.

In this case, the controller of the protective circuit, if appropriate also further components of the protective circuit or else the entire protective circuit, is supplied from the energy store. Via the series circuit comprising first diode and energy store, the series circuit being arranged in parallel with the input of the protective circuit, the protective circuit is able to charge the energy store from the PV module connected to the input of the protective circuit. This is the case in a normal state of the PV module, for example, in which the series circuit comprising the PV modules—and thus also the PV module connected to the input of the protective circuit—is operated at a maximum power point (MPP). In the normal state, therefore, an MPP voltage assigned to the MPP operating point is usually present as an input voltage at the input terminals of the protective circuit. The input voltage $U_{in}$ present at the input terminals of the protective circuit is positive in this case, i.e. $U_{in}>0$ V. In this case, the forward direction of the first diode is oriented in such a way that on the one hand it enables charging of the energy store in the normal state of the PV module, but on the other hand it prevents a discharge of the energy store via the input of the protective circuit upon a decrease in the input voltage $U_{in}$ present at the input terminals. In the normal state of the PV module, the first switch is usually permanently closed and thus permanently connects an input terminal to the output terminal assigned to the input terminal.

Furthermore, via the second diode, which connects an output terminal of the protective circuit to a midpoint of the series circuit comprising the first diode and the energy store, in conjunction with the first switch, charging of the energy store via the output terminals of the protective circuit is made possible. For this purpose, the second diode is interconnected in such a way that a series circuit comprising the second diode and the energy store is connected in parallel with the first switch.

The energy store is charged via the output terminals of the protective circuit for example if the PV module connected to the input is shaded and thus has a polarity state directed oppositely to a polarity state in the normal state of the PV module. In this case, the input voltage $U_{in}$ of the protective circuit that is present at the input terminals is negative, i.e. $U_{in}<0$ V. On account of the negative input voltage $U_{in}$, charging of the energy store from the PV module connected to the input is not possible, but a discharge of the energy store via the input terminals is prevented by the first diode. However, the energy store discharges on account of the energy consumption of the controller—and, if appropriate, of further components of the protective circuit—in the course of operation. In order therefore to ensure the supply of the controller and proper operation of the protective circuit even in the shaded state, the energy store is charged via the output terminals of the protective circuit if, e.g. on account of an insufficient input voltage $U_{in}$, this is not possible via the input terminals but is necessary for proper operation of the protective circuit.

In order to charge the energy store via the output terminals, a current is passed from one output terminal of the protective circuit via the first switch to the other output terminal of the protective circuit. The first switch is then temporarily opened proceeding from an initially closed state. In the open state, the current previously flowing via the closed first switch commutates to the series circuit comprising the second diode and the energy store and charges the latter. Once the energy store is sufficiently charged by the charge taken up, the first switch is closed again and the current commutates back to the first switch. The charging of the energy store is ended and the latter discharges again as a result of energy being drawn on the part of the controller and, if appropriate, further connected components in the course of operation of the protective circuit. After a renewed decrease in the energy stored in the energy store, this process is repeated.

In the shaded state of the PV module connected to the input, the current is generated by the unshaded PV modules within the series circuit comprising PV modules. In this case, the current flowing within the series circuit is passed from one output terminal of the protective circuit via a bypass path, which is connected in parallel with the input of the protective circuit, to the other output terminal of the protective circuit. In this case, the bypass path need not necessarily be part of the protective circuit itself. In this regard, by way of example, a bypass diode of the PV module connected to the protective circuit, the bypass diode being present anyway at the PV module, can also operate as a bypass path. Nevertheless, the bypass path can however also be—for example in the form of a second semiconductor switch and/or a bypass diode—part of the protective circuit itself.

The protective circuit can additionally also be used during a maintenance state of the PV module connected to the protective circuit. Even in the maintenance state, in which the PV module is usually removed, the energy store is charged via the output terminals, as also were described during the shaded state of the PV module. If appropriate it is necessary in the maintenance state, however, to provide a bypass path in parallel with the input of the protective circuit. In the event of a PV module not being connected on the input side, this can be carried out by means of an electrical connection of the input terminals to one another, e.g. via a wire bridge. In this case, it may be expedient to lead the input terminals two-fold in number, once for connecting the PV module and once for connecting the wire bridge, to a housing of the protective circuit.

Both in the shaded state and in the maintenance state of the PV module connected to the protective circuit on the input side, a current direction present at the output terminals of the protective circuit and also at the first switch is identical to a current direction such as is present in the case of a normal state of the corresponding PV module at the respective output terminals and respectively at the first switch of the protective circuit. Therefore, this does not involve a reverse current via the output terminals of the protective circuit that is directed oppositely to a current direction in the normal state of the corresponding PV module. The difference with respect to the normal state is, rather, that the current in the shaded state and also in the maintenance state is no longer generated or driven by the PV module assigned to the protective circuit, but rather principally by the adjacent PV modules of the series circuit. By virtue of the series circuit comprising second diode and energy store now being connected in parallel with the first switch, the protective circuit is designed to enable charging of the energy store with the same current direction in comparison with the normal state at the output terminals even in the shaded state and/or in the maintenance state.

Furthermore, the protective circuit according to the disclosure is able, in a safety situation, for example a fire situation, to disconnect the PV module connected to the input of the protective circuit from the output of the protective circuit and thus brings about a disconnection of the corresponding PV module that prevents an energy emission of the PV module. For this purpose, the first switch is permanently open and an input terminal is thus permanently disconnected from the output terminal assigned thereto. In the safety situation, i.e. with the first switch permanently open, the energy store is charged via the input terminals and thus via the PV module connected to the protective circuit on the input side.

On account of the small number of components, the protective circuit is able to be produced extremely simply and cost-effectively. As a result of the energy supply on the one hand via the input terminals and on the other hand via the output terminals, the protective circuit is usable for different states of the PV module, for example the normal state during MPP operation, the shaded state and also the maintenance state of the PV module—in that case even with the PV module not connected. In a safety situation the protective circuit likewise enables a disconnection of the PV module connected to the input. In this way, in the case of a PV system in which at least individual PV modules—or a sufficient number of PV modules—of a series circuit comprising PV modules have a protective circuit according to the disclosure, a voltage of connecting lines between the series circuit comprising PV modules and a PV inverter of the PV system can be kept below an endangerment-critical voltage value.

In one embodiment of the protective circuit according to the disclosure, the first switch is arranged in a connecting line between an input terminal assigned to a positive pole of the PV module and the positive output terminal assigned to the input terminal. In the case of this arrangement of the first switch, an anode of the first diode is connected to an anode of the second diode via the midpoint of the series circuit comprising the first diode and the energy store. In an alternative embodiment of the protective circuit according to the disclosure, the first switch is arranged in a connecting line between an input terminal assigned to a negative pole of the PV module and the negative output terminal assigned to the input terminal. In the case of this arrangement of the first switch, a cathode of the first diode is connected to a cathode of the second diode via the midpoint of the series circuit comprising the first diode and the energy store. In this case, the terms "positive pole" and "negative pole" of the PV module denote the "positive" and respectively "negative" pole of the PV module in each case at an open circuit voltage of the PV module.

In one embodiment of the protective circuit, the anode of the first diode is connected to the input terminal assigned to the positive pole of the PV module. In this case, one terminal of the energy store is connected to an input terminal assigned to the negative pole of the PV module, while the other terminal of the energy store is connected to the cathode of the first diode. In an alternative embodiment of the protective circuit, the cathode of the first diode is connected to the input terminal assigned to the negative pole of the PV module. In this case, one terminal of the energy store is connected to an input terminal assigned to the positive pole of the PV module, while the other terminal of the energy store is connected to the anode of the first diode. Both embodiments of the protective circuit have a forward direction of the first diode that enables the energy store to be charged via the input terminals given a sufficiently high input voltage $U_{in}$, but at the same time avoids a discharge of the energy store in the event of a decrease in the input voltage $U_{in}$ via the input terminals. In particular, a discharge of the energy store in the case of a negative input voltage $U_{in}<0$ is suppressed in both embodiments. Consequently, almost the entire energy, once it has flowed into the energy store, can be used as desired for supplying the controller and, if appropriate, further components of the protective circuit and an undesired dissipation of energy once it has been stored is avoided.

Advantageously, in one embodiment the energy store comprises a capacitor, a supercapacitor and/or a rechargeable battery. If the energy store comprises a combination of the capacitor and of the rechargeable battery and/or of the supercapacitor and of the rechargeable battery, the rechargeable battery is interconnected in parallel with the capacitor and/or the supercapacitor. Advantageously, in one embodiment the energy store can comprise a circuit for voltage stabilization or voltage limiting, for example a zener diode or a series regulator, which can be connected upstream or connected downstream of the energy store. In this case, a voltage limiting circuit connected upstream of the energy store prevents the energy store from being charged beyond a critical value and thus limits the charging voltage $U_{ES}$ dropped across the energy store to a predefined value. A voltage stabilization circuit or voltage limiting circuit connected downstream allows the energy store to be charged up to a value near the input voltage $U_{in}$, but is connected between the energy store and a consumer connected thereto, for example the controller. In any case, i.e. a voltage limiting circuit connected upstream or connected downstream, the consumer with supply via the energy store is prevented from experiencing a voltage that leads to a functional impairment or damage of the respective consumer.

In principle, either an electromechanical switch or a semiconductor switch is possible as the first switch. In one advantageous embodiment of the protective circuit, the first switch comprises a semiconductor switch. The semiconductor switch is advantageously a MOSFET (Metal Oxide Semiconductor Field Effect Transistor). In this regard, by way of example, a MOSFET relative to an IGBT (Insulated-Gate Bipolar Transistor) as semiconductor switch or first switch is characterized by a lower value of the volume resistance. As a result, with the first switch closed, the power loss dropped across the first switch is minimized. In this way, a necessary cooling of the first switch can be embodied relatively simply and cost-effectively, if not totally omitted. A lower value of the reverse voltage of a MOSFET in comparison with an IGBT can be tolerated here if, within a series circuit comprising PV modules, a sufficient number of the PV modules have a protective circuit according to the disclosure. In this way, the voltage to be blocked is divided among the number of MOSFETs present within the series circuit comprising PV modules.

In one embodiment, the protective circuit according to the disclosure furthermore comprises a bypass path in parallel with the input of the protective circuit. In this case, the bypass path optionally comprises a third diode, which is connected by its anode to the input terminal of the protective circuit that is assigned to the negative pole of the PV module, and by its cathode to the input terminal of the protective circuit that is assigned to the positive pole of the PV module. Consequently, even with a PV module not being connected to the protective circuit, the bypass path in this case is an integral part of the protective circuit itself. Advantageously, it is arranged together with the other components of the protective circuit within a common housing of the protective circuit. Upon removal of the PV module—e.g. in the case of a maintenance state—the bypass path therefore need not first be produced separately. Although this slightly increases the production costs of the protective circuit, in a maintenance situation it reduces the required outlay and can be overcompensated thereby.

For the case where the protective circuit comprises the bypass path, the bypass path can comprise a second switch, which is drivable via the controller of the protective circuit. In this case, the bypass path can comprise either only the second switch, but not the third diode, or else the second switch in combination with the third diode. In principle, an electromechanical switch is also possible as the second switch. Advantageously, however, the second switch comprises a semiconductor switch. For the case where the bypass path comprises both the second switch and the third diode, it is particularly advantageous—since cost-effective—if the second switch is a MOSFET (Metal Oxide Semiconductor Field Effect Transistor), in particular the third diode of the bypass path being formed by an intrinsic diode of the MOSFET. As necessary, the MOSFET can thus be turned on in the event of a current flow through the bypass path, as a result of which the power loss in the bypass path is drastically reduced. Since the supply of the controller is now always ensured according to the disclosure, the cooling can be designed in respect of this reduced power loss, as a result of which costs are saved. The PV module connected to the protective circuit on the input side can be short-circuited via the second switch. In this way, in the case of a safety situation, the DC voltage occurring within a PV system can additionally be reduced. By virtue of for example the first switch of the protective circuit being permanently open and the second switch being predominantly closed, the input voltage $U_{in}$ present at the input terminals can even be kept almost at 0 V. In this case, it is merely necessary for the second switch to be repeatedly momentarily opened in order to charge the energy store again. Within a series circuit comprising a plurality of PV modules having a protective circuit according to the disclosure, however, the opening of the second switch can be carried out in a manner temporally offset with respect to one another and as far as possible without a temporal overlap among one another, as a result of which, in the safety situation, the DC voltage occurring in the series circuit can once again be minimized and an additional redundancy is provided which, even in the case of a defective first switch, ensures an effective disconnection of the PV module connected on the input side. For example, the second switch may operate to provide a short circuit across the input terminals of the PV module, or otherwise prevent an energy transfer of the PV module connected to the input side between the input and the output of the protective circuit.

Although the controller of the protective circuit in principle is also able to be realized completely in analog form, in one advantageous embodiment the controller of the protective circuit comprises a microcontroller µC.

In a further embodiment, the protective circuit comprises a communication unit. In this case, the communication unit is configured to receive an external signal for driving the first switch and/or the second switch. The protective circuit is advantageously situated in spatial proximity to the PV module. The communication unit can receive an external signal for driving the first switch and/or the second switch, which external signal is generated by a superordinate central control unit, for example a photovoltaic (PV) inverter or a separate control unit. In this way, in reaction to the received external signal, the first and/or second switches of a plurality of protective circuits within a series circuit comprising PV modules that each comprise a protective circuit can be driven in a targeted manner.

The communication unit is able to carry out a unidirectional, but advantageously also a bidirectional communication, wherein the communication can be carried out in principle either wirelessly, e.g. by radio, or in a wired manner. In one advantageous embodiment of the protective circuit, the communication unit is configured to enable power line communication via a line connected to the output terminal. In this case, the protective circuit can optionally comprise a path in parallel with the output for coupling a power line signal out or in. Advantageously, the path in parallel with the output is designed to be of low impedance for a communication frequency of the power line signal and for this purpose has a series circuit comprising an inductance and a capacitor. In this way, it is ensured that even with the first switch open the power line signal can pass from the first output terminal to the second output terminal of the protective circuit, while a direct current from the first to the second output terminal is prevented. Consequently, power line communication is also made possible within a series circuit comprising a plurality of PV modules comprising a protective circuit according to the disclosure, even with disconnected PV modules.

Advantageously, a protective circuit comprising a microcontroller µC and/or a communication unit furthermore comprises at least one of the following components:
a first current sensor for detecting a charging current $I_{ES}$ flowing in the series circuit comprising the first diode and the energy store to the energy store or flowing away from the energy store,
a second current sensor for detecting an input current $I_{in}$ flowing between the PV module and one of the input terminals of the protective circuit,
a third current sensor for detecting an output current $I_{out}$ flowing between one of the output terminals of the protective circuit and the further PV modules connected to the protective circuit,
a first voltage sensor for detecting a charging voltage $U_{ES}$ dropped across the energy store,
a second voltage sensor for detecting an input voltage $U_{in}$ present between the input terminals of the protective circuit,
a third voltage sensor for detecting an output voltage $U_{out}$ present between the output terminals of the protective circuit, and
a fourth voltage sensor for detecting a switch voltage $U_{S1}$ dropped across the first switch.

The protective circuit is thus able to detect automatically specific states of the PV module connected to the protective circuit, for example a normal state, a shading state and/or a maintenance state of the PV module. In reaction to the detected state and/or in reaction to an external signal, the protective circuit can thus automatically carry out switching actions of the first and/or the second switch. Advantageously, the protective circuit is configured here in such a way as to drive the first switch and/or the second switch depending on at least one detected value from:

Charging current $I_{ES}$,
Input current $I_{in}$,
Output current $I_{out}$,
Charging voltage $U_{ES}$,
Input voltage $U_{in}$,
Output voltage $U_{out}$, and
Switch voltage $U_{S1}$.

In this case, the protective circuit, in particular the controller thereof, is also able to combine the values with one another, to evaluate a combination of the values and to drive the switches in accordance with the evaluated combination. The protective circuit can likewise be configured to drive the first and/or the second switch depending on the signal received by the communication unit.

A method for operating a protective circuit is characterized by the following steps carried out:
supplying the controller of the protective circuit with electrical energy from the energy store, wherein
the protective circuit is operated in a first operating state as long as the input voltage $U_{in}$ present at the input terminals lies within a first value range, wherein in the first operating state the energy store is charged via the input terminals with the first switch permanently closed; and wherein
the protective circuit is operated in a second operating state as long as the input voltage $U_{in}$ present at the input terminals lies within a second value range, wherein in the second operating state the energy store is charged via the output terminals by repeated temporary opening of the first switch; and wherein
the protective circuit, given the presence of predefined boundary conditions, is additionally operated in a third operating state, in which the first switch is permanently open, wherein in the third operating state the energy store is charged via the input terminals. In the third operating state, too, in a similar manner to the first operating state, the energy store is thus charged via the PV module connected to the protective circuit on the input side.

In this case, the first operating state of the protective circuit is assigned in particular to the normal state of the PV module connected to the protective circuit, in which the PV module is operated at a maximum power point (MPP). The second operating state of the protective circuit is assumed in particular if the PV module connected to the protective circuit has a shading state and/or a maintenance state. By virtue of the PV module having a maintenance state, the second operating state of the protective circuit can also be assumed if no PV module is connected to the protective circuit on the input side. If appropriate, in this case, the input terminals of the protective circuit are bridged via a separate bypass path, particularly if the protective circuit itself does not comprise the bypass path as an integral part of the protective circuit. The third operating state of the protective circuit is assigned to a safety or hazard situation during which a disconnection of the PV module connected to the protective circuit on the input side is desired.

The value ranges characterizing a magnitude of the input voltage $U_{in}$, i.e. the first value range and the second value range, should be understood as intervals and can either directly adjoin one another or else be spaced apart from one another. In this regard, the first and second value ranges can be spaced apart from one another via a third value range, for example, such that the first value range adjoins the third value range, which in turn again adjoins the second value range. In this case, an operating state which is assumed in the case of an input voltage $U_{in}$ lying in the third value range can respectively depend on what operating state was assumed previously and can correspond to the operating state respectively assumed previously. In this way, it is possible to realize a hysteresis-like change from the first operating state to the second operating state, and vice versa.

In the context of the application, an opening of the first switch—if appropriate also of the second switch—characterizes on the one hand a complete opening of the respective switch. In addition, however, the term opening within the meaning of the present application also encompasses a partial—and thus not complete—opening of the corresponding switch and is of importance in particular with the use of a semiconductor switch as first and/or second switch. In this regard, in the case of a semiconductor switch, in particular in the case of a MOSFET, an opening of the switch can be carried out as it were gradually by increasing the ohmic resistance of the switch. In this way, the opening of the semiconductor switch can also be carried out such that the switch voltage—for example $U_{S1}$—dropped across the switch is controlled, in particular is kept constant, or follows a predefined profile.

If the protective circuit comprises a bypass path having a second switch, during the operation of the protective circuit in the second operating state the second switch can be permanently closed in order to reduce a power loss. In this regard, the outlay for cooling the second switch can be minimized on account of a reduction of the power loss. In the context of the present application, the term closing also encompasses at least partial closing in which an ohmic resistance of the second switch is merely reduced, in particular gradually reduced. In this way, the second switch can perform the function of an active bypass diode during a shading state of the PV module connected to the protective circuit on the input side.

If the protective circuit comprises a bypass path having a second switch, it is possible, if the protective circuit is operated in the third operating state, to keep the input voltage $U_{in}$ at the input terminals of the protective circuit below a second limit value by closing the second switch. Specifically, the input voltage $U_{in}$ at the input terminals of the protective circuit can thus be kept below the second limit value for a large portion of a time duration during which the protective circuit is operated in the third operating state. In this case, the second switch is repeatedly temporarily, i.e. momentarily, opened only for the purpose of charging the energy store. A voltage of a PV module that occurs in a safety situation can thus be reduced almost to 0 V. Furthermore, a redundant safety during the disconnection of the corresponding PV module results from isolation of the PV module on account of an opened first switch in conjunction with a short circuit of the PV module on account of the closed second switch.

In one embodiment of the method, the predefined boundary conditions whose presence results in the protective circuit being operated in the third operating state comprise a signal received by the protective circuit or an absence of a signal previously received by the protective circuit. Signal here should be understood to mean, in particular, a regularly repeatedly transmitted signal, a so-called keep-alive signal. However, it is also possible for the protective circuit to be put into the third state and/or out of the latter by means of a characteristic signal. In this case, it is possible that otherwise a signal is repeatedly transmitted neither in the first operating state nor in the second operating state. In this case, the signal can be communicated from a superordinate central control unit, for example a photovoltaic (PV) inverter, either wirelessly—e.g. by radio—or in a wired manner—e.g. via power line communication—to the protective circuit or the communication unit thereof.

In one embodiment of the method, the repeated temporary opening of the first switch in the second operating state or the repeated temporary opening of the second switch in the third operating state takes place upon the undershooting of a lower threshold value of the charging voltage $U_{ES}$ dropped across the energy store. In this case, the opened state lasts in each case until the charging voltage $U_{ES}$ dropped across the energy store exceeds an upper threshold value. This results in a sawtooth-like temporal profile of the charging voltage $U_{ES}$, the amplitude of which profile is upwardly limited by the upper threshold value and downwardly limited by the lower threshold value. The temporal profile of the charging voltage $U_{ES}$ is thus similar to that of two-point regulation. In an alternative embodiment of the method, the repeated temporary opening of the first switch in the second operating state or the repeated temporary opening of the second switch in the third operating state takes place in the form of clocked driving of the respective switch with a duty factor. In this case, the duty factor is determined depending on a charging voltage $U_{ES}$ currently dropped across the energy store. An opening duration of the respective switch and thus a charging cycle is chosen to be all the greater, the smaller the charging voltage $U_{ES}$ dropped across the energy store. This, too, produces—at least as viewed on a microscopic time scale—a sawtooth-like profile of the charging voltage $U_{ES}$ dropped across the energy store. However, the charging voltage $U_{ES}$ itself can be regulated more finely on account of a customarily high clock frequency, or be kept in a narrower tolerance range.

In one advantageous embodiment of the method, a transition of the protective circuit into the third operating state comprises at least one of the following steps:
operating the first switch for a first time duration in linear operation regulated depending on the switch voltage $U_{S1}$ dropped across the first switch,
operating the first switch for a second time duration in linear operation at a temporally rising switch voltage $U_{S1}$ dropped across the first switch,
shifting an operating point of the PV module connected to the protective circuit or of all PV modules of the series circuit comprising PV modules in the direction of an open circuit voltage of the PV modules via a photovoltaic (PV) inverter connected to the series circuit comprising PV modules, and bringing about an associated power reduction of the series circuit comprising PV modules.

Generally, it is advantageous to completely open the first switch upon the transition to the third operating state in a state as free of load as possible, but at least in a state with load reduced as far as possible. By virtue of the first switch then being operated for a first time duration in linear operation regulated depending on the switch voltage $U_{S1}$ dropped across the first switch, a power reduction of the series circuit comprising PV modules can be brought about without the first switch being loaded above its reverse voltage and/or above its maximum temperature and thereby being damaged. In this case, the regulated linear operation can specifically pursue the aim of regulating the switch voltage $U_{S1}$ dropped across the first switch to a constant value. In this way, within the first time duration the first switches of a plurality or of all of the protective circuits within the series circuit comprising the PV modules can thus open even with a small time offset with respect to one another and collectively support the power reduction of the series circuit comprising the PV modules, without one individual first switch or a plurality of individual first switches being damaged in the process. In this case, the constant switch voltage $U_{S1}$ dropped across the first switch is chosen to be as high as possible, on the one hand, in order to bring about as rapid power reduction as possible. On the other hand, however, it is chosen in each case below an allowed reverse voltage of the first switch. In addition, when choosing the constant switch voltage $U_{S1}$, consideration should also be given to keeping a temperature loading of the first switch within the first time duration always below a critical temperature loading for the first switch, and thus to avoiding damage to the first switch. In a similar manner and with the similar boundary conditions, a temporally rising switch voltage $U_{S1}$ dropped across the first switch also brings about a corresponding power reduction of the series circuit comprising the PV modules.

By shifting an operating point of the PV module connected to the protective circuit or of all the PV modules of the series circuit comprising PV modules in the direction of an open circuit voltage of the PV modules, a power reduction of the series circuit comprising the PV modules is likewise effected. In this case, however, the power reduction is brought about via a photovoltaic (PV) inverter connected to the series circuit comprising PV modules.

If the protective circuit comprises a bypass path having a second switch $S_2$, one advantageous method comprises the following steps upon a transition of the protective circuit to the third operating state:
bringing about a power reduction of the series circuit comprising PV modules, before an opening of the first switch, wherein
bringing about the power reduction comprises closing the second switch of the protective circuit or closing the second switches of a plurality of protective circuits of PV modules within the series circuit comprising PV modules.

By means of closing the second switch of the protective circuit or closing the second switches of a plurality of protective circuits of PV modules within the series circuit comprising PV modules, with a link circuit voltage kept constant in a PV inverter to which the series circuit comprising PV modules is connected, a power reduction of the series circuit comprising PV modules is likewise brought about. Specifically, an operating point of the PV module connected to the protective circuit on the input side, upon the second switch of the protective circuit being closed, is shifted in the direction of a short circuit of the PV module. The operating points of the further PV modules, in the case of whose protective circuit the second switch is not yet closed, are thus shifted in the direction of their open circuit voltage. A power reduction of the individual PV modules of the series circuit comprising PV modules is effected in both cases. However, consideration should be given here to ensuring that, if a protective circuit is assigned to each PV module of the series circuit comprising PV modules, the second switches of all the protective circuits are not closed. This is because a link circuit of the PV inverter would be short-circuited in this case. Specifically, here the second switch of at least one protective circuit, if appropriate also of a plurality of protective circuits, should remain open.

In one advantageous embodiment, the power reduction upon the transition to the third operating state is brought about in such a way that closing the second switch of the protective circuit or closing the second switches of a plurality of protective circuits of PV modules within the series circuit comprising PV modules is not carried out abruptly, but rather in a temporally extended manner. In this case, the second switch respectively to be closed, upon the transition from the open to the closed state, is operated during a third time duration, which is greater by a multiple than a minimum switching duration of the second switch, in linear operation with a temporally decreasing ohmic resistance. In addition, the output current or a parameter that permits the output current to be deduced is detected within the third time duration, if appropriate also temporally after that. The detection pursues the aim of determining a point in time at which the output current is zero or an output current in the reverse direction forms proceeding from a forward directed output current. A current in the reverse direction is taken to mean here a reverse current within the series circuit comprising PV modules. Advantageously, the first switch of the protective circuit—or the first switches of a plurality of protective circuits within the series circuit comprising PV modules—is then opened if a magnitude of the output current undershoots a current threshold value. By virtue of the magnitude of the output current undershooting the current threshold value, it is possible to assume a load-free, but at least load-reduced, state within the series circuit comprising the PV modules. By contrast, if an output current in the forward direction above the current threshold value is also still present even after a second switch has been closed, then sufficient power reduction of the series circuit comprising PV modules has not yet been achieved. In this case, the first switch is not yet opened and the output current continues to be observed. In this case, further second switches of the protective circuits within the series circuit comprising PV modules can then be closed successively and in each case in a temporally extended manner. In this way, with each closing of a further second switch—with otherwise an identical voltage difference between the ends of the series circuit comprising PV modules, which can be controlled via an inverter connected to the series circuit—the power and in particular the current of the series circuit comprising PV modules is reduced step by step. The current within the series circuit comprising PV modules corresponds to the detected output current in the corresponding protective circuits. The step-by-step reduction is continued until the detected output current undershoots the current threshold value. Upon the current threshold value being undershot, the first switch of the protective circuit or the first switches of the protective circuits within the series circuit comprising PV modules is/are opened.

A photovoltaic (PV) system according to the disclosure comprises a PV inverter with at least one series circuit comprising PV modules that is connected to the PV inverter. In this case, at least one of the PV modules comprises a protective circuit according to the disclosure. Advantageously, a plurality of PV modules of the series circuit comprise the protective circuit according to the disclosure. In this case, the number thereof can be chosen such that a voltage occurring within the series circuit comprising the PV modules in the hazard situation is always kept below a maximum allowed voltage. In this case, it should be taken into consideration that a sum of reverse voltages of the first switches installed overall in the series circuit comprising the PV modules is always greater than the open circuit voltage of the series circuit comprising the PV modules. In one embodiment, all the PV modules of the series circuit comprise the protective circuit according to the disclosure.

Advantageous developments of the disclosure are evident from the patent claims, the description and the drawings. The advantages of features and of combinations of a plurality of features as mentioned in the description are merely by way of example and can take effect alternatively or cumulatively, without the advantages necessarily having to be afforded by the embodiments according to the disclosure. Without hereby modifying the subject matter of the accompanying patent claims, the following holds true with regard to the disclosure content of the original application documents and of the patent: further features can be gathered from the drawings—in particular the illustrated relative arrangement and operative connection of a plurality of components. The combination of features of different embodiments of the disclosure or of features of different patent claims is likewise possible in a manner deviating from the chosen dependency references in the patent claims and is hereby suggested. This also concerns such features which are illustrated in separate drawings or are mentioned in the description thereof. These features can also be combined with features of different patent claims. Features presented in the patent claims can likewise be omitted for further embodiments of the disclosure.

The features mentioned in the patent claims and the description should be understood with regard to their number such that exactly the number or a greater number than the stated number is present, without the need for explicit use of the adverb "at least". Thus, if one element is mentioned, for example, this should be understood to mean that exactly one element, two elements or more elements are present. These features can be supplemented by other features or be the sole features of which the respective product consists.

The reference signs contained in the patent claims do not restrict the scope of the subjects protected by the patent claims. They merely serve the purpose of making the patent claims more easily understood.

BRIEF DESCRIPTION OF THE DRAWINGS

The disclosure is explained and described in further detail below on the basis of preferred exemplary embodiments illustrated in the figures.

FIG. 1b shows a second embodiment of the protective circuit according to the disclosure;

FIG. 2a schematically illustrates a current profile during the first operating state on the basis of the example of a third embodiment of the protective circuit;

FIG. 2b schematically illustrates a current profile during the second operating state on the basis of the example of the third embodiment of the protective circuit from FIG. 2a;

FIG. 2c schematically illustrates a current profile of the protective circuit during the third operating state on the basis of the example of the third embodiment of the protective circuit from FIG. 2a;

FIG. 3 shows temporal profiles of switching states of the first and second switches and corresponding temporal profiles of individual electrical variables during the second operating state on the basis of the example of the protective circuit from FIG. 2a.

FIG. 4 shows temporal profiles of switching states of the first and second switches and corresponding temporal profiles of individual electrical variables during the third operating state of the protective circuit from FIG. 2a.

FIG. 5 shows a flow diagram of a method according to the disclosure for operating the protective circuit from FIG. 2a.

DESCRIPTION OF FIGS

Figure 1A:
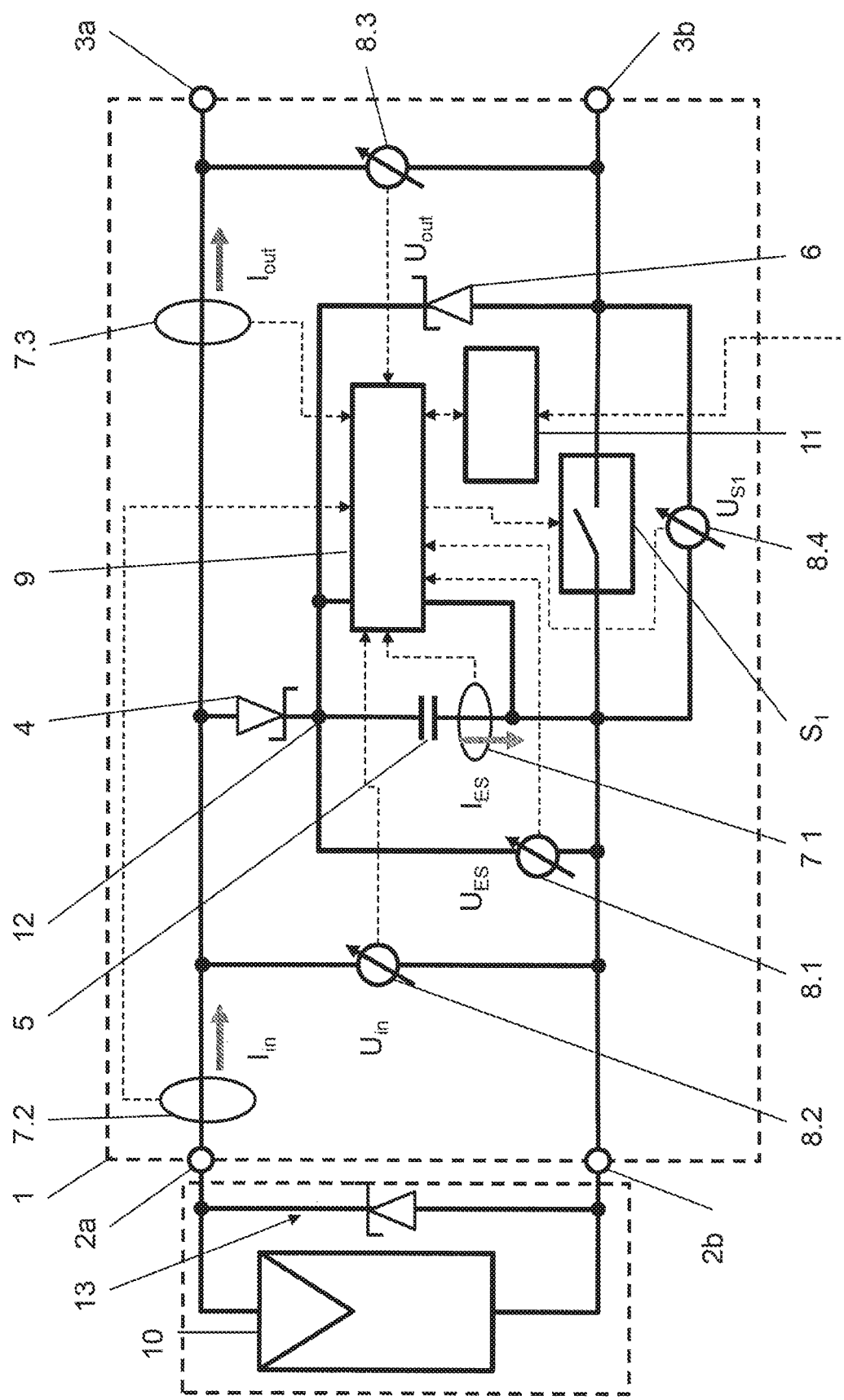
FIG. 1a shows a first embodiment of the protective circuit according to the disclosure.

FIG. 1a shows the construction of a first embodiment of a protective circuit 1 according to the disclosure. The protective circuit 1 comprises an input having two input terminals 2a, 2b for connecting a PV module 10 and an output having two output terminals 3a, 3b for connecting further PV modules 10 of a series circuit comprising PV modules 10. In this case, individual, if appropriate also all of the further PV modules 10 of the series circuit can likewise comprise a protective circuit 1 of this type. An input terminal 2a assigned to a positive pole of the PV module 10 is directly connected to a first output terminal 3a of the protective circuit, while an input terminal 2b assigned to a negative pole of the PV module 10 is connected to a second output terminal 3b via a first switch $S_1$. The first switch $S_1$ is driven via a controller 9, which is symbolized by means of a dashed arrow. The controller 9 is supplied via an energy store, here illustrated in the form of a capacitor 5. The capacitor is interconnected in series with a first diode 4, wherein the series circuit comprising first diode 4 and capacitor 5 is connected in parallel with the input of the protective circuit. Furthermore, the protective circuit comprises a second diode 6, which is connected anodally to the second output terminal 3b and cathodally to a midpoint 12 of the series circuit comprising first diode 4 and capacitor 5. In this case, the first diode 4 is oriented with regard to its forward direction such that its cathode is connected to the cathode of the second diode 6. The protective circuit 1 furthermore comprises a communication unit 11, which is able to receive a communication signal. In this case, the communication unit 11 is configured in such a way as to receive the communication signal in a wired manner, e.g. by means of power line communication via lines connected to the output terminals 3a, 3b. As an alternative thereto, however, the communication unit can also be configured to receive the communication signal wirelessly, e.g. by radio.

Various current and voltage sensors are connected to the controller 9, which connections are likewise symbolized by dashed arrows. A first current sensor 7.1 measures a charging or discharging current $I_{ES}$ flowing via the capacitor 5 as energy store. A second current sensor 7.2 measures an input current $I_{in}$ flowing from the PV module 10 via one of the input terminals 2a, 2b—here the input terminal 2a assigned to the positive pole of the PV module 10. A third current sensor 7.3 measures an output current $I_{out}$ flowing via one of the output terminals 3a, 3b—here the first output terminal 3a—to the adjacent PV modules 10 of the series circuit comprising PV modules 10 that is connected to the protective circuit on the output side. A first voltage sensor 8.1 measures a charging voltage $U_{ES}$ dropped across the capacitor 5 as energy store, the charging voltage serving as a measure of the state of charge of the energy store. A second voltage sensor 8.2 measures an input voltage $U_{in}$ present at the input terminals 2a, 2b. In the case of a normal state of the connected PV module 10, the input voltage is positive, i.e. $U_{in}=U(2a)-U(2b)>0$, and usually corresponds to the MPP voltage of the PV module 10 connected on the input side. In a shading state of the corresponding PV module 10, the input voltage $U_{in}$ is negative, i.e. $U_{in}=U(2a)-U(2b)<0$. A third voltage sensor 8.3 measures the output voltage $U_{out}$ present at the output terminals 3a, 3b. In the first operating state of the protective circuit 1, in which state the first switch $S_1$ is permanently closed, the input terminals 2a, 2b of the protective circuit 1 are connected with low impedance to the assigned output terminals 3a, 3b and the input voltage $U_{in}$ is substantially equal to the output voltage $U_{out}$. A fourth voltage sensor 8.4 measures a switch voltage $U_{S1}$ dropped across the first switch $S_1$. The controller 9 comprises a microcontroller μC and is designed to drive the first switch $S_1$ depending on at least one detected parameter from the group: charging current $I_{ES}$, input current $I_{in}$, output current $I_{out}$, charging voltage $U_{ES}$, input voltage $U_{in}$, output voltage $U_{out}$ and switch voltage $U_{S1}$ or a combination thereof. The controller 9 is likewise designed to drive the first switch $S_1$ depending on the communication signal received by the communication unit 11.

An external bypass path 13 in the form of a bypass diode inherently connected to the PV module 10 is connected to the protective circuit 1 in accordance with FIG. 1a on the input side in parallel with the PV module 10. This is symbolized by a rectangle drawn in a dashed manner around both components in FIG. 1a. In this embodiment, the protective circuit 1 does not comprise a bypass path 13 as an integral part of the protective circuit 1 itself.

FIG. 1b shows an alternative second embodiment of the protective circuit 1 according to the disclosure. The latter corresponds in many details to the first embodiment already described under FIG. 1a, and in this regard reference is made to the corresponding explanations of the description concerning FIG. 1a. At this juncture, rather, a description is therefore given of the differences between the second embodiment and the first embodiment.

In contrast to the protective circuit 1 in accordance with FIG. 1a, in the embodiment in accordance with FIG. 1b, the first switch $S_1$ is arranged between the input terminal 2a assigned to the positive pole of the PV module and the corresponding first output terminal 3a. The series circuit comprising capacitor 5 and first diode 4 here is connected in parallel with the input of the protective circuit 1 in a manner interchanged in its order. In this case, however, the flow direction of the first diode 4 relative to the polarity of the PV module 10 connected to the protective circuit 1 is unchanged. In both cases—FIG. 1a and FIG. 1b—the flow direction of the first diode 4 enables the capacitor 5 to be charged via the input terminals 2a, 2b given a sufficiently high positive input voltage $U_{in}$, but prevents the undesired discharge of the capacitor via the input terminals 2a, 2b given a negative input voltage $U_{in}<0$. In FIG. 1b, the second diode 6 is connected anodally to the anode of the first diode 4 via the midpoint 12 of the series circuit comprising first diode 4 and capacitor 5, and cathodally to the first output terminal 3a. In both cases—FIG. 1a and FIG. 1b—a series circuit comprising capacitor 5 and second diode 6 is connected in parallel with the first switch $S_1$ and thus enables an electrical path to which a current previously flowing via the closed first switch $S_1$ can commutate upon the opening of the first switch $S_1$.

In addition to FIG. 1a, the protective circuit 1 in accordance with FIG. 1b comprises two additional input terminals 15a, 15b led out to a housing of the protective circuit 1. The additional input terminals 15a, 15b can be connected to a wire bridge, for example, if, in the maintenance situation, the PV module 10 with the bypass diode as bypass path 13, the bypass diode being inherently assigned to the PV module 10, is removed, in order to ensure an electrical path from the first output terminal 3a via the first switch $S_1$ to the second output terminal 3b even when the PV module 10 is not present.

FIG. 2a shows a current profile during the first operating state of the protective circuit 1 on the basis of the example of a third embodiment of the protective circuit 1. For the sake of clarity, the illustration here shows only the voltage sensors 8.1, 8.2, 8.3, 8.4 but not the current sensors 7.1, 7.2, 7.3. In addition, the communication unit 11 is not illustrated, for the sake of clarity. Notwithstanding this, the components not illustrated in FIG. 2a can nevertheless be present, however. The third embodiment, too, has commonalities with the first embodiment in accordance with FIG. 1a, and with regard to the commonalities reference is made to the corresponding explanations under the description concerning FIG. 1a.

In contrast to FIG. 1a, the embodiment in FIG. 2a now comprises a bypass path 13 as an integral part of the protective circuit 1. For this purpose, the bypass path 13 is arranged for example in a common housing together with further components of the protective circuit 1. The bypass path 13 comprises a third diode 14 and a semiconductor switch, here a MOSFET, as second switch $S_2$. In the case of the MOSFET, the third diode 14 can be embodied by a body diode of the MOSFET. It is likewise possible, however, for the bypass path 13 also to comprise a separate third diode 14, particularly if the semiconductor switch as second switch $S_2$ is not a MOSFET. The first switch $S_1$ is also embodied as a MOSFET in this embodiment. Both the first switch $S_1$ and the second switch $S_2$ are drivable by the controller 9. In the third embodiment of the protective circuit 1, as also in the previous embodiments, a path of low impedance for an alternating current signal as communication signal—e.g. a power line signal—can be connected in parallel with the output terminals. The path is not illustrated in FIG. 2a for reasons of clarity. The low-impedance path comprises a series circuit comprising inductance and capacitor and ensures that a communication signal arriving at one output terminal 3a, 3b can pass through the protective circuit 1 to the respective other output terminal 3b, 3a even with the first switch $S_1$ open. In this case, the low-impedance path is of low impedance only for the alternating current signal, i.e. the communication signal, while it is of high impedance or nontransmissive for a direct current.

In the first operating state, the PV module 10 connected to the protective circuit 1 is in a normal state and is operated at the MPP, maximum power point, but at least in the vicinity thereof. The input voltage $U_{in}$ here is positive, $U_{in}>0$, and is substantially equal to the MPP voltage. The first switch $S_1$ is permanently closed and thus provides a low-impedance path between the second output terminal 3b and the input terminal 2b assigned to the negative pole of the PV module 10. The second switch $S_2$ is permanently open in the first operating state. In a current profile assigned to the first operating state, a current 20 flows via the second output terminal 3b, the first switch $S_1$, via the input terminal 2b assigned to the negative pole, the PV module 10, via the input terminal 2a assigned to the positive pole of the PV module 10 and via the first output terminal 3a. In this case, a small partial current 21 flows via the series circuit comprising first diode 4 and energy store, here in the form of the capacitor 5—and charges the latter. In the first operating state, the capacitor 5 is charged almost continuously by the partial current 21 provided that the magnitude of the input voltage $U_{in}$ allows this. For the protection of the consumers, in particular the controller 9, connected to the energy store—here the capacitor 5—for the purpose of the supply, the energy store can furthermore comprise means for voltage stabilization or for voltage limiting, such as e.g. zener diodes, series regulators or shunt regulators. These are not illustrated in FIG. 2a for reasons of clarity.

Figure 2B:
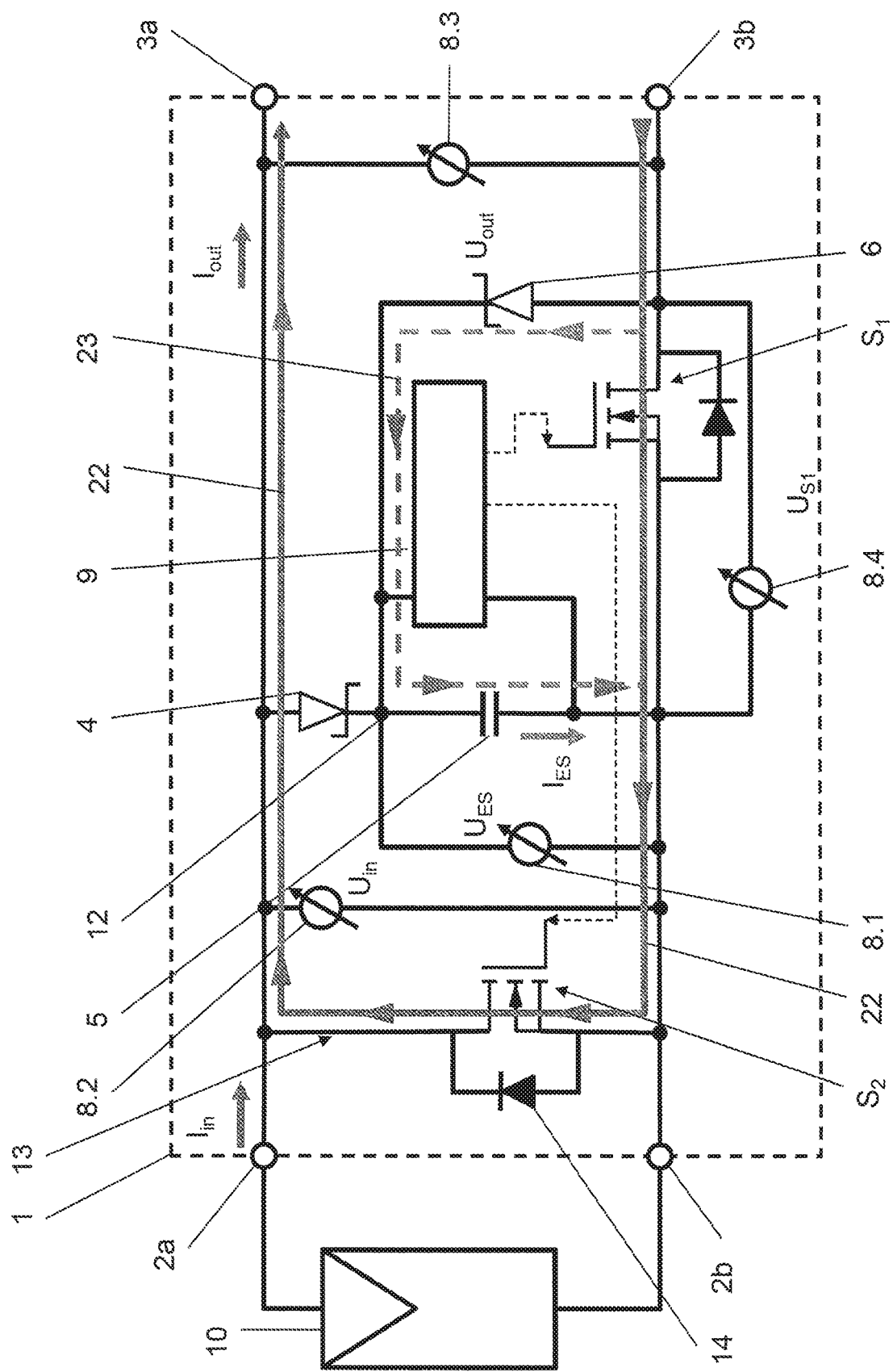

FIG. 2b illustrates the current profile during the second operating state, which is assumed for example during a shading state or a maintenance state of the PV module 10 connected to the protective circuit 1 on the input side. The basis of the illustration is the third embodiment of the protective circuit 1 as already shown in FIG. 2a.

In the shading state of the PV module 10, the input voltage $U_{in}$ is negative, $U_{in}<0$. In this operating state, the second switch $S_2$ is permanently closed and thus provides a low-impedance connection between the input terminals 2a, 2b via the bypass path 13. The first switch $S_1$, too, is predominantly closed from a temporal standpoint. It is repeatedly temporarily—i.e. momentarily—opened only for the charging of the energy store, here the capacitor 5, and is then closed again. In the open state, a current 22 previously flowing via the first switch $S_1$ commutates to the series circuit comprising second diode 6 and energy store, here in the form of the capacitor 5, the series circuit being connected in parallel with the first switch $S_1$. From the standpoint of this short time period a partial current 23 thus results, which charges the capacitor 5 as energy store. The partial current 23 can be the entire or just a fraction of the current 22 flowing previously via the first switch $S_1$, depending on the extent to which the first switch $S_1$ was opened, i.e. what ohmic volume resistance arose across it. In order to differentiate between the two current paths, in FIG. 2b the partial current 23 is illustrated in a dashed manner, while the current 22 is illustrated in a solid manner.

Figure 2C:
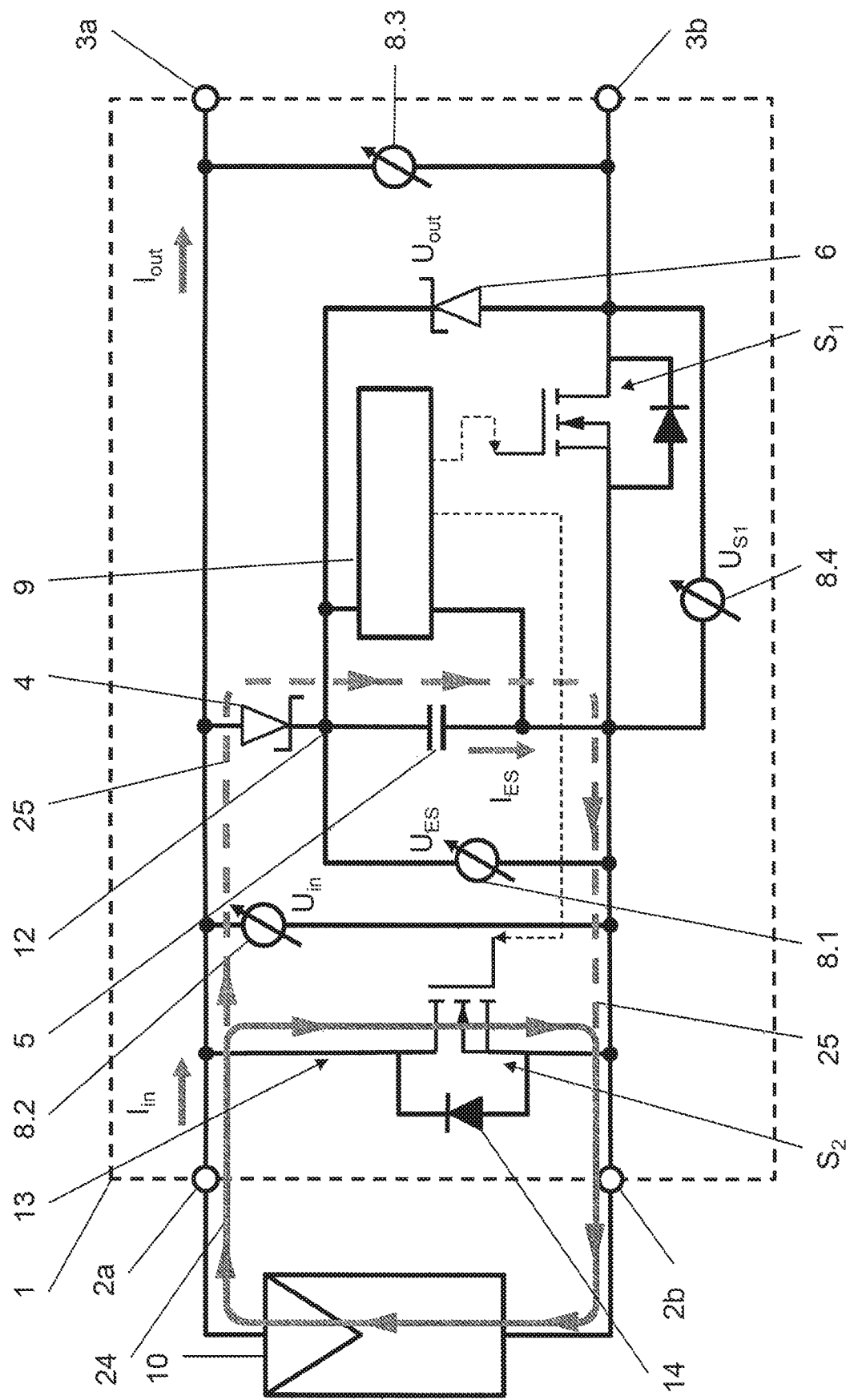

FIG. 2c illustrates the current profile during the third operating state of the protective circuit 1, which is assumed for example during a safety or hazard situation. Here, too, the basis of the illustration is the third embodiment of the protective circuit 1 as already shown in FIG. 2a. The third operating state is assumed by the protective circuit 1 only under predefined boundary conditions, and is therefore signaled to the protective circuit 1 in a suitable manner. This signaling can be effected for example by means of absence of a power line signal that previously was regularly present at the output terminals 3a, 3b of the protective circuit 1 and received by the communication unit 11.

During the operation of the protective circuit 1 in the third operating state, the first switch $S_1$ is permanently open and an energy emission of the PV module 10 from the input terminals 2a, 2b to the output terminals 3a, 3b is prevented. In addition, the second switch $S_2$ of the protective circuit is predominantly closed from a temporal standpoint and thus short-circuits the PV module 10 connected to the input. In this way, a redundant safety arises since an energy emission of the PV module 10 is prevented firstly on account of an input voltage being almost 0 V, $U_{in}\approx0$ V, and also by means of a disconnection between input and output of the protective circuit. In the third operating state, a short-circuit current 24 of the PV module 10 flows via the input terminals 2a, 2b and the second switch $S_2$. Since the capacitor 5 as energy store slowly discharges on account of the energy consumption of the controller 9, it must be charged again. The capacitor 5 is charged in the third operating state by the second switch $S_2$ being repeatedly temporarily opened. While the second switch $S_2$ is open, a partial current 25 previously flowing via the second switch $S_2$ then flows via the series circuit comprising first diode 4 and capacitor 5 back to the PV module 10. The capacitor 5 as energy store is charged again by means of the partial current 25. The rise in the input voltage $U_{in}$, the rise occurring during the open state of the second switch $S_2$, and also the time duration of the open state of the second switch $S_2$ can be kept at very small values here. Moreover, opening of the second switches $S_2$ of a series circuit comprising PV modules 10 with corresponding protective circuits 1 can be effected in a manner temporally offset with respect to one another. The voltage that occurs even in the case of a fault situation of the first switches $S_1$ overall at the ends of the series circuit comprising the PV modules 10, i.e. the string voltage, can be minimized as a result. The risk of a disconnection not being properly carried out in the hazard situation can also be reduced again as a result. In FIG. 2c the partial current 25 is illustrated in a dashed manner, while the current 24 flowing in the short-circuit case is illustrated in a solid manner.

In the embodiments in FIGS. 1a, 1b, 2a, 2b and 2c, the energy store is illustrated by way of example as a capacitor 5. As an alternative or in addition to the capacitor 5 illustrated, however, the energy store can also comprise a supercapacitor and/or a rechargeable battery.

FIG. 3 illustrates temporal profiles of switching states of the first switch $S_1$ and the second switch $S_2$ and resultant temporal profiles of individual electrical variables during the second operating state of the protective circuit 1. Specifically they are: a temporal profile 33 of the switch voltage $U_{S1}$, dropped across the first switch $S_1$, a profile 34 of the charging voltage $U_{ES}$ dropped across the capacitor 5 as energy store, and a profile 35 of the output voltage $U_{out}$. The descriptions concerning FIG. 3 and FIG. 4 are given by way of example taking account of the third embodiment of the protective circuit 1 in accordance with FIG. 2a.

During the second operating state of the protective circuit 1, the second operating state identifying shading or a maintenance state of the PV module 10, the second switch $S_2$, as illustrated in the corresponding profile 32, is closed throughout. The first switch $S_1$ is closed predominantly from a temporal standpoint, i.e. over a long time duration 38, and is open only during a short time duration 37. In this case, in contrast to the illustration shown, the opening of the MOSFET as first switch $S_1$ need not be effected completely. Rather, it is sufficient if the first switch $S_1$ is opened only to an extent such that on account of the rising ohmic resistance between its drain and source contacts, a sufficiently large partial current 23 of the current 22 is passed via the series circuit comprising second diode 6 and capacitor 5, the series circuit being arranged in parallel with the first switch $S_1$. In the short time duration 37, therefore, a raised value of the switch voltage $U_{S1}$ can be observed, while the switch voltage $U_{S1}$ falls to a small and usually negligible value during the longer time durations 38, within which the first switch $S_1$ is completely closed. During the short time durations 37, the capacitor 5 is charged by the partial current 23 flowing via it, and this results in a rise in the profile 34 of the charging voltage $U_{ES}$ dropped across the capacitor 5. In the longer time durations 38, by contrast, a continuous fall in the charging voltage $U_{ES}$ results on account of the consumption of the controller 9 and, if appropriate, further consumers connected to the capacitor 5. This results in the sawtooth-like or triangular profile 34 of the charging voltage $U_{ES}$ as illustrated in FIG. 3. The temporal profile 35 of the output voltage $U_{out}$ of the protective circuit 1 is fixed at a negative value of very low magnitude within the longer time durations 38, during which the first switch $S_1$ is closed, on account of the second switch $S_2$ being closed throughout. It is only within the short time durations 37, during which the first switch $S_1$ is open, that the output voltage $U_{out}$ approximately mirrors the inverse value of the charging voltage $U_{ES}$ dropped across the capacitor 5. On account of a relatively low volume resistance of the MOSFET as second switch $S_2$, at the latter only a low power loss is to be dissipated and an outlay for cooling the second switch $S_2$ can be kept low and simple, if not even be entirely obviated. The same applies also to the first switch $S_1$ embodied as a MOSFET, given correspondingly short time durations 37 and/or switch voltages $U_{S1}$ kept low.

FIG. 4 illustrates temporal profiles 41, 42 of switching states of the first switch $S_1$ and of the second switch $S_2$ and resultant temporal profiles of individual electrical variables during the third operating state of the protective circuit 1. Specifically, FIG. 4 schematically illustrates the temporal profile 43 of the input voltage $U_{in}$, the profile 44 of the charging voltage $U_{ES}$ dropped across the capacitor 5 as energy store, and the profile 45 of the output voltage $U_{out}$.

In the third operating state, the PV module 10 is disconnected and an energy emission thereof is suppressed. That is, the energy flow from the PV module to the output of the protective circuit is prevented. The disconnection is effected here in the present case by means of two redundant measures, namely a first switch $S_1$ being completely open throughout in order to disconnect the output from the input of the protective circuit 1—cf. temporal profile 41—and a predominantly closed second switch $S_2$, which additionally short-circuits the PV module 10 in the closed state—here during the long time durations 48. The second switch $S_2$, as illustrated in the corresponding temporal profile 42, is opened only repeatedly temporarily, i.e. over short time durations 47. During these time durations 47, a partial current 25 is generated via the series circuit comprising first diode 4 and capacitor 5 as energy store, the partial current charging the capacitor 5 again. Accordingly, here, too, the result is a sawtooth-like or triangular profile—similar to FIG. 3—of the charging voltage $U_{ES}$ dropped across the energy store. The output of the protective circuit 1 is free of voltage throughout, as also illustrated in the profile 45 of the output voltage $U_{out}$.

FIG. 5 illustrates a flow diagram of a method according to the disclosure for operating the protective circuit 1 on the basis of the example of a PV system comprising a series circuit comprising a plurality of PV modules 10. In this case, each of the PV modules 10 of the series circuit comprising PV modules is connected to a protective circuit 1. The protective circuits 1 are connected via their output terminals in order to form the series circuit comprising the plurality of PV modules 10. A respective output terminal of the two outer protective circuits 1 is connected to a DC input of a PV inverter, which is in turn connected to a power supply grid in order to feed in generated electrical power. By way of example, the method is illustrated under the assumption that each of the protective circuits 1 is designed in accordance with FIG. 2a.

The method starts at S50, e.g. in the morning at a time of day stipulated by sunrise. The first switch $S_1$ and the second switch $S_2$ are completely open at this time. Act S51 then involves checking whether an external signal, a so-called keep-alive signal, is received by the communication unit 11 of the protective circuit 1, whereby an infeed-ready state of the PV system is signaled. In this case, the keep-alive signal can be impressed as an external signal for example by a PV inverter in the context of power line communication on DC connection lines of the series circuit comprising the PV modules 10. If the keep-alive signal is not present (NO), it can be assumed that an infeed-ready state of the PV system is not present. In this case, at a later point in time a check is repeatedly made to establish whether the keep-alive signal is received at S51. If the keep-alive signal is not detected a number of times, then this can be interpreted as a termination condition and the method can be ended prematurely. By contrast, if a keep-alive signal is detected at S51 (YES), then at S52 the input voltage $U_{in}$ of the protective circuit 1 is measured by means of the second voltage sensor 8.2, which corresponds to the open circuit voltage of the PV module in this switch state of the first switch $S_1$ and of the second switch $S_2$. Act S53 involves checking whether the input voltage $U_{in}$ is greater than or equal to a third limit value $U_3$, $U_{in} \geq U_3$. If this is not the case (NO), then it can be assumed that sufficient irradiation is not yet present, and the method jumps back to S51, which is repeated after a waiting time has elapsed. By contrast, if the input voltage $U_{in}$ is greater than or equal to the third limit value $U_3$ (YES at S53), $U_{in} \geq U_3$, then in a step S54 the first switches $S_1$ of the protective circuits are closed. Thus the PV modules 10 of the series circuit comprising PV modules 10 are connected to one another and a current flow from a PV module 10 to the adjacent PV module 10 within the series circuit comprising PV modules 10 can take place. The second switch $S_2$ is completely opened provided that it is not already completely open anyway.

Act S55 then involves checking once again whether the keep-alive signal is also still being received. If the keep-alive signal is also still present as external signal (YES), that is to say the PV system is still ready for infeed, an energy emission of the PV module 10 connected to the protective circuit 1 can take place.

For the energy emission, the method then jumps to S56, in which the input voltage $U_{in}$ of the protective circuit 1 is once again detected. For reasons of measurement accuracy, this detection advantageously takes place in a state of the respective protective circuit 1 in which the second switch $S_2$ is open. In the illustrated case, the value ranges characterizing a magnitude of the input voltage $U_{in}$ are chosen such that the first value range directly adjoins the second value range. In this case, the first value range is characterized by positive values of the input voltages $U_{in} > 0$), while the second value range is characterized by negative values of the input voltages $U_{in}(U_{in} < 0)$. Accordingly, a subsequent act S57 then involves monitoring whether the input voltage $U_{in}$ detected last is positive, i.e. whether $U_{in} > 0$ holds true. If this is the case (YES), then a normal state of the corresponding PV module 10 can be assumed and the protective circuit 1 is operated in the first operating state at S58. The first operating state identifies MPP operation of the PV module 10 connected to the protective circuit 1. In the first operating state, the first switch $S_1$ is closed throughout, while the second switch $S_2$ is open throughout. The energy store—here the capacitor 5—is charged via the input terminals 2a, 2b. By contrast, if the input voltage is negative (NO at S57), i.e. $U_{in} < 0$ holds true, then the method jumps to S59, in which the protective circuit is operated in the second operating state. In this case, the second operating state identifies a shading state of the PV module 10 connected to the protective circuit 1. Here the second switch $S_2$ is completely closed in order to minimize the power loss. The first switch $S_1$ is likewise predominantly closed from a temporal standpoint, but is repeatedly temporarily opened for the purpose of charging the energy store—here the capacitor 5.

By contrast, if at S55 the keep-alive signal is not received by the communication unit 11 of the protective circuit 1 (NO), then this signals a safety or hazard situation of the PV system. In this case, the method changes to S60, in which the protective circuit 1 is operated in the third operating state, identifying the safety or hazard situation. In this operating state, the PV module 10 connected to the protective circuit 1 is disconnected and an energy emission of the PV module is prevented. The disconnection is carried out here in a redundant manner by virtue of the first switch $S_1$ being operated such that it is open throughout and, in addition, the second switch $S_2$ being operated such that it is predominantly closed from a temporal standpoint. The second switch $S_2$ is repeatedly temporarily opened only for the purpose of charging the energy store.

Act S61 involves repeatedly or constantly checking whether a termination condition for ending the method is met. If this is not the case (NO), then the method jumps back to S55, in which receiving the keep-alive signal signals whether the PV system is also still infeed-ready or whether a safety or hazard situation is present. Via the loop in the flow diagram from act S61 back to act S55 the method is also able to change from one operating state to a respective other operating state. In this case, the loop is iterated until the termination condition at S61 is met (YES). The method is then ended at S62. The termination condition can be defined for example by the reaching of a specific time of day at which it can be assumed that sunset has taken place. As an alternative thereto, the termination condition can also comprise repeated occurrence of a keep-alive signal not having been received.

The invention claimed is:

1. A protective circuit for a photovoltaic (PV) module, comprising:
   an input having two input terminals configured to connect to the PV module,
   an output having two output terminals configured to connect to further PV modules of a series circuit comprising PV modules,
   a first switch configured to connect one of the input terminals to one of the output terminals, and
   a controller configured to control the first switch,
   wherein the protective circuit further comprises a series circuit comprising a first diode and an energy store, wherein the series circuit is arranged in parallel with the input of the protective circuit,
   wherein the protective circuit further comprises a second diode, which connects an output terminal of the protective circuit to a midpoint of the series circuit comprising the first diode and the energy store, and
   wherein another series circuit comprising the second diode and the energy store is connected in parallel with the first switch.

2. The protective circuit as claimed in claim 1, wherein an anode of the first diode is connected to an anode of the second diode via the midpoint of the series circuit comprising the first diode and the energy store, or wherein a cathode of the first diode is connected to a cathode of the second diode via the midpoint of the series circuit comprising the first diode and the energy store.

3. The protective circuit as claimed in claim 1, wherein an anode of the first diode is connected to the input terminal assigned to a positive pole of the PV module, or wherein a cathode of the first diode is connected to the input terminal assigned to a negative pole of the PV module.

4. The protective circuit as claimed in claim 1, wherein the energy store comprises a capacitor, a supercapacitor and/or a rechargeable battery.

5. The protective circuit as claimed in claim 1, wherein the first switch comprises a MOSFET.

6. The protective circuit as claimed in claim 1, wherein the protective circuit further comprises a bypass path in parallel with the input of the protective circuit, wherein the bypass path comprises a third diode, which is connected by its anode to the input terminal of the protective circuit that is assigned to a negative pole of the PV module, and by its cathode to the input terminal of the protective circuit that is assigned to a positive pole of the PV module.

7. The protective circuit as claimed in claim 6, wherein the bypass path comprises a second switch, which is configured to be driven by the controller.

8. The protective circuit as claimed in claim 7, wherein the second switch is a MOSFET, and wherein the third diode of the bypass path is formed by an intrinsic diode of the MOSFET.

9. The protective circuit as claimed in claim 1, wherein the controller comprises a microcontroller (μC).

10. The protective circuit as claimed in claim 1, wherein the protective circuit comprises a communication unit configured to receive an external signal for driving the first switch and/or the second switch.

11. The protective circuit as claimed in claim 10, wherein the communication unit is configured to enable power line communication via a line connected to the output terminal, and wherein the protective circuit comprises a path of low impedance for a power line signal in parallel with the output of the protective circuit, wherein the path comprises a series circuit comprising an inductance and a capacitor.

12. The protective circuit as claimed in claim 9, wherein the protective circuit comprises at least one of the following components:
- a first current sensor configured to detect a charging current flowing in the series circuit comprising the first diode and the energy store to the energy store or flowing away from the energy store,
- a second current sensor configured to detect an input current flowing between the PV module and one of the input terminals of the protective circuit,
a third current sensor for detecting an output current flowing between one of the output terminals of the protective circuit and the further PV modules connected to the protective circuit,
- a first voltage sensor configured to detect a charging voltage dropped across the energy store,
- a second voltage sensor configured to detect an input voltage present between the input terminals of the protective circuit,
- a third voltage sensor configured to detect an output voltage present between the output terminals of the protective circuit, and
- a fourth voltage sensor configured to detect a switch voltage dropped across the first switch.

13. The protective circuit as claimed in claim 12, wherein the controller is configured to drive the first switch and/or the second switch depending on at least one detected value from:
the charging current,
the input current,
the output current,
the charging voltage,
the input voltage,
the output voltage, and
the switch voltage.

14. A method for operating a protective circuit that comprises:
an input having two input terminals configured to connect to the PV module,
an output having two output terminals configured to connect to further PV modules of a series circuit comprising PV modules,
a first switch configured to connect one of the input terminals to one of the output terminals, and
a controller configured to control the first switch,
wherein the protective circuit further comprises a series circuit comprising a first diode and an energy store, wherein the series circuit is arranged in parallel with the input of the protective circuit,
wherein the protective circuit further comprises a second diode, which connects an output terminal of the protective circuit to a midpoint of the series circuit comprising the first diode and the energy store, and
wherein another series circuit comprising the second diode and the energy store is connected in parallel with the first switch, the method comprising:
supplying the controller of the protective circuit with electrical energy from the energy store,
wherein the protective circuit is operated in a first operating state as long as the input voltage $U_{in}$ present at the input terminals lies within a first value range, wherein in the first operating state the energy store is charged via the input terminals with the first switch permanently closed;
wherein the protective circuit is operated in a second operating state as long as the input voltage $U_{in}$ present at the input terminals lies within a second value range, wherein in the second operating state the energy store is charged via the output terminals by repeated temporary opening of the first switch; and
wherein the protective circuit, given the presence of predefined boundary conditions, is additionally operated in a third operating state, in which the first switch is permanently open, wherein in the third operating state the energy store is charged via the input terminals.

15. The method as claimed in claim 14,
wherein the protective circuit further comprises a bypass path in parallel with the input of the protective circuit, wherein the bypass path comprises a third diode, which is connected by its anode to the input terminal of the protective circuit that is assigned to a negative pole of the PV module, and by its cathode to the input terminal of the protective circuit that is assigned to a positive pole of the PV module, wherein the bypass path comprises a second switch, which is configured to be driven by the controller, and
wherein during the operation of the protective circuit in the second operating state the second switch is permanently closed in order to reduce a power loss.

16. The method as claimed in claim 15, wherein in the third operating state of the protective circuit the input voltage at the input terminals is kept below a second limit value by closing of the second switch, and wherein the second switch is repeatedly temporarily opened for the purpose of charging the energy store.

17. The method as claimed in claim 14, wherein the predefined boundary conditions whose presence results in the protective circuit being operated in the third operating state comprise a signal received by the protective circuit or an absence of a signal previously received by the protective circuit.

18. The method as claimed in claim 14, wherein a repeated temporary opening of the first switch in the second operating state and/or—provided that the protective circuit comprises the second switch—the repeated temporary opening of the second switch in the third operating state takes place upon an undershooting of a lower threshold value of the charging voltage dropped across the energy store and lasts in each case until the charging voltage dropped across the energy store exceeds an upper threshold value.

19. The method as claimed in claim 14, wherein a repeated temporary opening of the first switch in the second operating state and/or a repeated temporary opening of the second switch in the third operating state are/is clocked driving with a duty factor, wherein the duty factor is determined depending on a charging voltage, dropped across the energy store.

20. The method as claimed in claim 14, wherein a transition of the protective circuit into the third operating state comprises at least one of the following acts:

operating the first switch for a first time duration in linear operation regulated depending on the switch voltage dropped across the first switch, operating the first switch for a second time duration in linear operation at a temporally rising switch voltage dropped across the first switch, shifting an operating point of the PV module connected to the protective circuit or of all PV modules of the series circuit comprising PV modules in the direction of an open circuit voltage of the PV modules via a photovoltaic PV inverter connected to the series circuit comprising PV modules, and bringing about an associated power reduction of the series circuit comprising PV modules.

21. The method as claimed in claim 15, wherein a transition of the protective circuit into the third operating state comprises:

bringing about a power reduction of the series circuit comprising PV modules, before an opening of the first switch, wherein bringing about the power reduction comprises closing the second switch of the protective circuit or closing the second switches of a plurality of protective circuits of PV modules within the series circuit comprising PV modules.

22. The method as claimed in claim 21, wherein closing the second switch of the protective circuit or closing the second switches of a plurality of protective circuits of PV modules within the series circuit comprising PV modules takes place in such a way that the second switch respectively to be closed, upon the transition from the open to the closed state, is operated during a third time duration in linear operation with a temporally decreasing ohmic resistance, wherein the output current is detected, and wherein the first switch is opened if a magnitude of the output current undershoots a current threshold value.

23. A photovoltaic (PV) system comprising a PV inverter with at least one series circuit comprising PV modules that is connected to the PV inverter, wherein at least one of the PV modules comprises a protective circuit that comprises:

an input having two input terminals configured to connect to the PV module, an output having two output terminals configured to connect to further PV modules of the series circuit comprising PV modules, a first switch configured to connect one of the input terminals to one of the output terminals, and a controller configured to control the first switch, wherein the protective circuit further comprises a series circuit comprising a first diode and an energy store, wherein the series circuit is arranged in parallel with the input of the protective circuit, wherein the protective circuit further comprises a second diode, which connects an output terminal of the protective circuit to a midpoint of the series circuit comprising the first diode and the energy store, and wherein another series circuit comprising the second diode and the energy store is connected in parallel with the first switch.

* * * * *